United States Patent [19]

Mok

[11] Patent Number: 5,065,045

[45] Date of Patent: Nov. 12, 1991

[54] MULTISTAGE OFFSET-CANCELLED VOLTAGE COMPARATOR

[75] Inventor: Tsung Dai Mok, Cupertino, Calif.

[73] Assignee: Atmel Corporation, San Jose, Calif.

[21] Appl. No.: 592,605

[22] Filed: Oct. 4, 1990

[51] Int. Cl.[5] .................. H03K 5/22; H03K 5/153; G06G 7/12
[52] U.S. Cl. .................................. 307/355; 307/362; 307/494
[58] Field of Search ............... 307/350, 355, 362, 354, 307/357, 352, 491, 494

[56] References Cited

U.S. PATENT DOCUMENTS

| | | | |
|---|---|---|---|
| 3,477,031 | 11/1969 | Nagata | 330/30 |
| 4,028,558 | 6/1977 | Heller et al. | 307/355 |
| 4,211,942 | 7/1980 | Aoki et al. | 307/355 |
| 4,523,107 | 6/1985 | Peterson | 307/352 |
| 4,553,052 | 11/1985 | Takahashi | 307/355 |
| 4,558,233 | 12/1985 | Nakamori | 307/354 |
| 4,603,267 | 7/1986 | Kowallek | 307/362 |
| 4,667,165 | 5/1987 | De Weck | 330/253 |
| 4,760,286 | 7/1988 | Pigott | 307/350 |
| 4,883,987 | 11/1989 | Fattaruso | 307/491 |
| 4,962,323 | 10/1990 | Ta | 307/355 |

FOREIGN PATENT DOCUMENTS 0145100 6/1985 European Pat. Off. ............ 307/362
0296816 12/1986 Japan ................................. 307/350

OTHER PUBLICATIONS

D. C. Wyland, "FET Cascade Technique Optimizes Differential Amplifier Performance", Electronics, Jan. 18, 1971, pp. 81–84.

Primary Examiner—Eugene R. LaRoche
Assistant Examiner—Evelyn A. Lester
Attorney, Agent, or Firm—Schneck & McHugh

[57] ABSTRACT

A multistage voltage comparator having plural transfer stages between successive comparator stages. Each transfer stage includes capacitors connected between the outputs of one stage and the inputs of the next stage. The capacitors are also connected to a reference voltage line via MOS transistor switches. The switches are characterized by progressively slower turn-off times for each successive transfer stage so that turn off is sequential. The comparator is a differential amplifier with two complementary inputs and outputs. The complementary outputs of the final stage are loaded into a latch and then transferred to an RS flip-flop providing a digital logic output representative of at least a quantization step difference in the inputs to the first comparator stage.

19 Claims, 2 Drawing Sheets

MULTISTAGE OFFSET-CANCELLED VOLTAGE COMPARATOR

DESCRIPTION

1. Technical Field

The present invention relates to field-effect transistor circuits for comparing plural input signals one to another as to amplitude, especially such circuits including plural amplifier stages cascaded, and in particular relates to the interstage coupling of such circuits.

2. Background Art

Many applications, such as analog-to-digital conversion in a digital audio system, require voltage comparisons between two inputs which are of very high resolution. For example, a voltage comparator circuit might be required to detect a difference between 1 volt and 1.000001 volt. High resolution comparisons can be performed by high speed CMOS amplifiers. Examples of such circuits are described in U.S. Pat. No. 4,760,286 to Pigott, U.S. Pat. No. 4,667,165 to De Weck, U.S. Pat. No. 4,603,267 to Kowalcek, and U.S. Pat. No. 3,477,031 to Nagata.

Because the voltage gain, i.e. the ratio of the voltage difference between the two output terminals to the voltage difference between the two inputs, for any single comparator circuit is limited, plural amplifier stages are typically cascaded or placed in tandem in order to achieve high resolution. Each stage multiplies the voltage difference output by the preceding stage. Good resolution depends to a large extent on the interstage coupling. Direct coupling of one stage to the next stage causes an offset current to also be multiplied, thereby limiting resolution.

An object of the present invention is to provide a very high resolution voltage comparator circuit which operates on a power supply of five volts or less.

DISCLOSURE OF THE INVENTION

The above object has been met with a multistage voltage comparator having plural differential comparator stages and plural differential transfer stages located between successive comparator stages. Each differential transfer stage includes charge storage elements, such as capacitors, connected between the outputs of one stage and the inputs of the next stage. The charge storage elements are also connectable to a reference voltage line via MOS transistor switches. The transistor switches turn on or close during an initial calibration or a reset cycle in order to set the comparator stage inputs to a reference potential. The switches are characterized by turn-off speeds which are progressively slower for each successive transfer stage, so that they turn off or open in sequence from one stage to the next. Turn-off speed can be made slower, for example, by increasing the MOS transistor's channel width, by reducing the MOS transistor's channel length, or both.

An advantage of the invention is that the offset voltages output by each comparator stage get properly stored across the capacitors before the transistor switches open. Opening the switches sequentially causes the differential output to be transferred from one comparator stage to the next without transferring a substantially multiplied offset current as well.

BEST MODE FOR CARRYING OUT THE INVENTION

Figure 1:
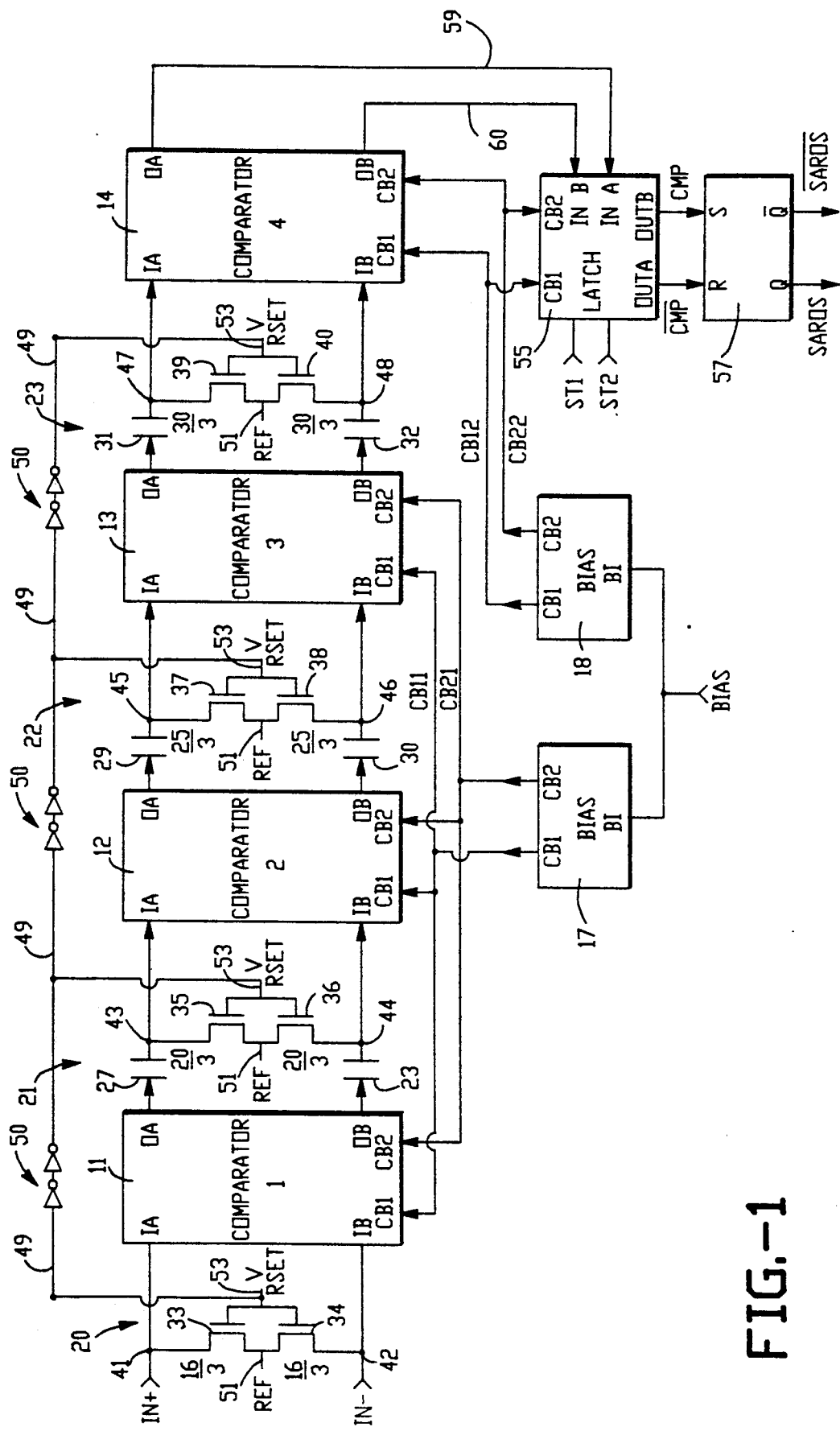
FIG. 1 is an electrical schematic of the multistage voltage comparator of the present invention, with comparator stages and bias circuits shown as blocks.
Figure 2:
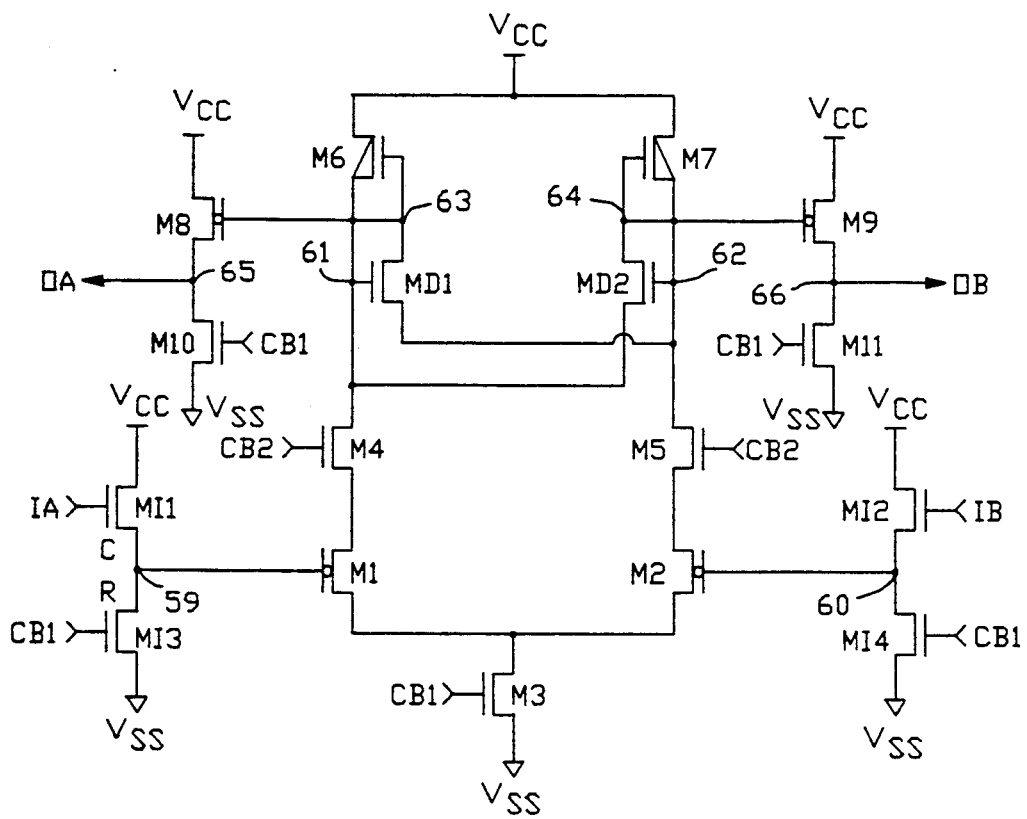
FIG. 2 is an electrical schematic of a comparator stage for the comparator in FIG. 1.
Figure 3:
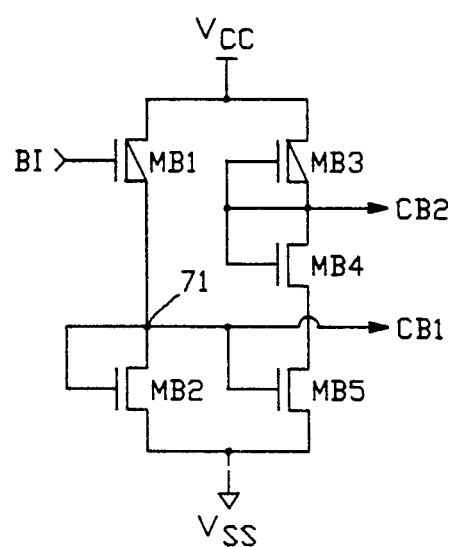
FIG. 3 is an electrical schematic of a bias circuit of the comparator in FIG. 1.

With reference to FIG. 1, a voltage comparator includes a plurality of comparator stages 11-14, shown here as four comparator stages. Each comparator stage 11-14 has a pair of inputs, designated as IA and IB. Likewise, each comparator stage 11-14 has a pair of outputs, designated as OA and OB. One of the inputs IA receives a positive potential relative to a reference potential REF or ground, while the other of the inputs IB receives a negative potential relative to the reference potential REF or ground. Similarly, one of the outputs OA has a negative potential and the other of the outputs OB has a positive potential relative to reference potential REF. As seen in FIG. 2, each of the comparator stages typically comprises a differential amplifier with a balanced transistor structure, and so, the particular input that receives the relatively positive potential and the one that receives the relatively negative potential is arbitrary. Returning to FIG. 1, each comparator stage also has a pair of bias inputs CB1 and CB2 from bias circuits 17 and 18. Details of a typical bias circuit are shown in FIG. 3.

The voltage comparator also includes a plurality of differential transfer stages 21-23 located between successive comparator stages 11-14 and providing coupling between the comparator stages 11-14. In general, there is no differential transfer stage either on the input side of the first comparator stage 11 or on the output side of the last comparator stage 14, here shown as stage four. The input side of the first comparator stage includes a circuit 20 constructed like the differential transfer stages 21-23 to reset the input voltage signals IN+ and IN− prior to each comparison. Each differential transfer stage 21-23 includes a pair of charge storage elements, such as capacitors 27 and 28, 29 and 30, and 31 and 32 connected between the outputs OA and OB of one comparator stage 11-13 and the inputs IA and IB of the next comparator stage 12-14. The capacitors are preferably formed out of a double layer of polysilicon, each typically about 80 μm square, separated by an oxide insulating layer. Each transfer stage 21-23 also includes a pair of MOS transistor switches 35 and 36, 37 and 38, and 39 and 40 connected between nodes 43-48 and a common reference voltage line 51. The nodes 43-48 to which the switches 35-40 are connected are located between the capacitors 27-32 and the corresponding inputs IA and IB of the succeeding comparator stage 12-14. The gates of the transistor switches 35-40 are toggled by a reset signal $V_{RSET}$ on a common reset line 53. The circuit construction 20 at the input side of the first comparator stage 11 also includes transistor switches 33 and 34 connected between the nodes 41 and 42 and the common reference voltage line 51 with their gates being toggled by the reset signal $V_{RSET}$. While the transistor switches 33-40 are shown as each being a single n-channel transistor, each switch 33-40 could also be made up of a pair of complementary n- and p- channel transistors connected in parallel and with respective gates toggled by complementary reset signals $V_{RSET}$ and $V_{\overline{RSET}_L}$.

A feature of the present invention is that the response of the switches 33-40 to a simultaneous change in the reset signal $V_{RSET}$ is not identical for the input reset circuit 20 and the differential transfer stages 21-23. Transistor switches 33 and 34 of the input reset circuit 20 have a size represented by respective channel width and length of the transistors, of 16/3. Transistor switches 35 and 36 of the first transfer stage 21 have a size of 20/3. Transistor switches 37 and 38 of the second transfer stage 22 have a size of 25/3. Transistor switches 39 and 40 of third transfer stage 23 have a size of 30/3. Thus, each successive transfer stage has transistor switches with successively wider channels. Typically, all other parameters being constant, an increase in channel width or a decrease in channel length or both, causes an increase in transistor turn-on speed and correspondingly shorter turn-on time. The same change in channel size causes a decrease in transistor turn-off speed and a correspondingly longer turn-off time. In this invention, the principal parameter of interest is the turn-off speeds and times of the different transistor switches 33-40. The representative sizes given above result in transistor switches characterized by turn-off speeds which, beginning with the input reset circuit 20, are progressively slower for each successive transfer stage 21-23. Thus, the switches 33-40 turn off sequentially in time from one stage to the next, starting with switches 33 and 34, next switches 35 and 36, then switches 37 and 38, and lastly with switches 39 and 40. Additional delay in turning the switches on and off could be introduced by passing the reset signal $V_{RSET}$ from one circuit to the next via a line 49 with pairs of inverters 50 on the line for a time delay.

The voltage comparator, typically, also includes a latch 55 and an R-S flip-flop 57 for storing comparator outputs on lines 59 and 60 from the last comparator stage 14 and providing a digital logic output SAROS indicative of at least a quantization step difference in the input voltages IN+ and IN− to the comparator. The latch 55 has a pair of inputs INA and INB connected to respective signal lines 59 and 60 to receive outputs OA and OB from comparator stage 14. Latch 55 also has a pair of outputs OUTA and OUTB providing to the R-S flip-flop 57 the stored copies CMP and $\overline{CMP}$ of the latch inputs INA and INB. Biasing inputs CB1 and CB2, which can be clocked, from bias circuit 18 and latch strobe signals ST1 and ST2 are typically provided to latch 55 as well. The R-S flip-flop 57 has a reset input R connected to receive the strobed output $\overline{CMP}$ from latch 55, representative of the amplified positive input signal IN+ to the first comparator stage 11. R-S flip-flop 57 also has a set input S connected to receive the strobed output CMP from latch 55, representative of the amplified negative input signal IN− to the first comparator stage 11. One output Q of the flip-flop 57 goes logic high if the set input S exceeds a threshold voltage. Output $\overline{Q}$ goes logic low if the reset input R exceeds the threshold. A complementary output Q is also typically provided.

With reference to FIG. 2, a comparator stage 11-14 is typically a differential amplifier circuit with complementary outputs OA and OB to an output driver pair. The circuit includes a first input driver consisting of two MOS n-channel transistors MI1 and MI3, connected in series between a power supply $V_{cc}$ and ground $V_{ss}$, and a second input driver of similar construction with transistors MI2 and MI4. The comparator inputs IA and IB connect to the gates of upper transistors MI1 and MI2 and thus are capacitively coupled to the comparator stage. A bias control signal CB1 is applied to lower transistors MI3 and MI4 which provide a resistance to ground $V_{ss}$ for the input drivers. The input drivers' outputs 59 and 60 are located between transistors MI1 and MI3, and between transistors MI2 and MI4, respectively.

The circuit also includes the differential amplifier per se, made up of MOS transistors M1-M7. Unimplanted n-channel transistors M1 and M2 with low threshold drops between transistor gates and sources are connected to receive the input driver outputs 59 and 60 at their gates. The sources of transistors M1 and M2 are connected to ground $V_{ss}$ through n-channel transistor M3, which provides a biasing current for the amplifier. The gate of transistor M3 is connected to bias signal CB1. The drains of transistors M1 and M2 are connected through cascode transistors M4 and M5, which provide extra gain and speed, to pull-up transistors M6 and M7. Pull-up transistors M6 and M7 provide a pull-up resistance to the power supply $V_{cc}$ for the amplifier.

The circuit includes a cross-coupled data clamp, made up of MOS n-channel transistors MD1 and MD2 and pull-up transistors M6 and M7, for limiting the amplified comparison result in order to minimize settling time. The gates 61 and 62 of the transistors MD1 and MD2 form the clamp inputs and are coupled to the amplifier portion between pull-up transistors M6 and M7 and cascode transistors M4 and M5. N-channel cascode transistors M4 and M5 have gates connected to input CB2 from bias circuits 17 and 18 of FIG. 1. When either transistor M4 or M5 turns on, the clamp limits the voltage differential between nodes 61 and 62 to within one threshold. The clamp itself has sources of transistors MD1 and MD2 connected to the gates of the other. Drains of transistors MD1 and MD2 connect to the pull-up transistor gates and drains M6 and M7 respectively and form the clamp outputs 63 and 64.

The circuit includes two output drivers. A first output driver includes an unimplanted n-channel transistor M8 and an n-channel transistor M10, the signal from clamp output 63 being input at the gate transistor M8. Using unimplanted n-channel devices maintains the same potentials between nodes 63 and 65 and between nodes 64 and 66. Transistors M8 and M10 are connected in series between power supply $V_{cc}$ and ground $V_{ss}$, and transistor M10 provides a source of resistance to ground $V_{ss}$. Transistor M10 is biased by control signal CB1 from a bias circuit. The output OA is connected at the node 65 between transistors M8 and M10. The second output driver is similarly constructed of transistors M9 and M11, with signal input from latch output 64 to the gate of transistor M9 and signal output OB at node 66 between transistors M9 and M11. Outputs OA and OB are complementary outputs that are amplified complementary inputs IA and IB.

Typical transistor sizes for the comparator stages are set forth in Table A. The first number represent channel width in micrometers, while the second number represents channel length. The only differences between comparator stages in this example are between the transistors M3, M6 and M7 in the first two and last two stages. The later stages have been optimized to provide more speed and less gain compared to earlier stages.

While preferred, this modification is optional and all comparator stages could be identical.

TABLE A

| Transistor | Stages 1 and 2 | Stages 3 and 4 |
|---|---|---|
| MI1,MI2 | 200/3 | 200/3 |
| MI3,MI4 | 40/4 | 40/4 |
| M1,M2 | 400/3.5 | 400/3.5 |
| M3 | 45/4 | 80/4 |
| M4,M5 | 400/2.5 | 400/2.5 |
| M6,M7 | 40/12 | 80/12 |
| MD1,MD2 | 7/3 | 7/3 |
| M8,M9 | 100/4 | 100/4 |
| M10,M11 | 40/4 | 40/4 |

With reference to FIG. 3, a typical biasing circuit includes a first set of biasing transistors MB1 and MB2 and a second set of biasing transistors MB3, MB4 and MB5. Transistors in each set are connected in series between the power supply $V_{cc}$ and ground $V_{ss}$. The gate of n-channel transistor MB1 receives a clock input signal BI. The gate of transistor MB2 is connected to the node 71 between transistors MB1 and MB2. Typical transistor sizes (channel width and length) are 60/6 for transistor MB1, and 20/4 for transistor MB2. Node 71 forms a first output bearing a bias signal CB1. The second set of transistors include a pair of transistors MB3 and MB4 of respective sizes 30/12 and 40/3 with gates of both connected together and to the node 73 between transistors MB3 and MB4. A third transistor MB5 of size 12/8 is connected between transistor MB4 and ground $V_{ss}$ and has a gate connected to node 71 for receiving first bias signal CB1. The node 73 between transistors MB3 and MB4 form a second output bearing bias signal CB2. If clocked, the leading pulse edge of bias signal CB2 lags that of bias signal CB1.

Referring again to FIG. 1, the operation of the comparator begins with a reset signal $V_{RSET}$ on the gate inputs 53 of transistor switches 33–40 which turns on all of the switches 33–40 and resets inputs IN+ and IN− and all of the nodes 41–48 to a reference potential REF. One side of the coupling capacitors is charged to the offset voltage at the comparator output. This offset voltage is a result of offset currents in transistor characteristics due to processing variations. When the reset signal $V_{RSET}$ is removed from the MOS transistor switches 33–40, the switches turn off, beginning with those switches 33 and 34 having a faster turn-off time and continuing sequentially with other switches 35 and 36, next 37 and 38, and then 39 and 40, having slower turn-off times. Turning off switches 35 and 36 causes the offset voltages to be stored across the capacitors. Storing the offset from each stage sequentially assures that any residual offset errors do not get amplified. Complementary input signals IN+ and IN− are applied to the inputs IA and IB of the first comparator stage 11. The input signals are compared and amplified, stored in the clamp portion MD1 and MD2 of comparator stage 11 of FIG. 2 and output from outputs OA and OB. Outputting a signal from comparator stage 11 charges up capacitors 27 and 28, raising and lowering nodes 43 and 44, respectively, to the voltages at output OA and OB of stage 11, and thereby transferring the differential output voltage to the inputs IA and IB of the next stage 12. This comparison and transfer occurs for each successive stage up to the outputs OA and OB of the last comparison stage 14. The outputs from the final stage are loaded into latch 55, then transferred into R-S flip-flop 57.

The invention's use of a capacitive transfer with sequential switching allows the differential output voltages to be transferred from one stage to the next, the output being amplified at each stage so that a high resolution can be achieved. The capacitors minimize the transfer and multiplication of an offset current which might reduce the achievable resolution. Making the transistor switches with different turn-off times allows switching off to be automatic with a single control signal $V_{RSET}$ causing sequential turn-off.

I claim:

1. A circuit for coupling a plurality of comparators comprising,
   a plurality of comparator stages, each stage having a set of inputs and a set of outputs,
   a plurality of transfer stages located between successive comparator stages, each transfer stage including a set of charge storage elements connected between said set of outputs of one comparator stage and said set of inputs of a next comparator stage, and a set of MOS transistor switches responsive to a reset signal, each switch connected between a reference voltage line and a node located between one of said charge storage elements and an input of said next comparator stage,
   wherein said transistor switches are characterized by turn-off speeds which are progressively slower for each successive transfer stage, whereby switches turn off sequentially from one stage to the next.

2. The circuit of claim 1 wherein said MOS transistor switches are characterized by at least one of increasing channel widths and decreasing channel lengths in successive transfer stages.

3. The circuit of claim 1 wherein said comparator stages comprise differential amplifiers.

4. The circuit of claim 1 wherein said set of outputs is a pair of complementary outputs relative to said reference voltage line.

5. The circuit of claim 1 wherein successive comparator stages have equal or decreasing voltage gains relative to preceding stages.

6. The circuit of claim 1 wherein said comparator stages have a strobe terminal responsive to a strobe signal for passing comparator stage output values to said pair of outputs.

7. The circuit of claim 1 further comprising means connected to said pair of outputs of a last stage of said comparator stages for storing comparator output values from said last stage.

8. The circuit of claim 1 wherein said comparator stages and transfer stages together form a CMOS integrated circuit with inputs leading to a first comparator stage and outputs leading from a final comparator stage.

9. The circuit of claim 1 wherein said charge storage elements are capacitors.

10. A circuit for coupling a plurality of comparators comprising,
    a plurality of comparator stages, each stage being a differential amplifier having a pair of inputs and a pair of outputs, said pairs of inputs and outputs being complementary relative to a reference voltage line,
    a plurality of differential transfer stages located between successive comparator stages, each differential transfer stage including a pair of charge storage elements and a pair of MOS transistor switches, each charge storage element being connected between an output of one comparator stage and an input of a next comparator stage, a node being located between each charge storage element and the corresponding input of the next comparator stage to which that capacitor is connected, each MOS transistor switch being connected between a node and said reference voltage line, said MOS transistor switches being characterized by turn-off speeds which are progressively slower for each successive transfer stage, said MOS transistor switches being responsive to a common reset signal for turning on and off said switches, whereby switches turn off sequentially from one stage to the next, and means connected to receive signals from said pair of outputs of a final one of said plurality of comparator stages for providing digital logic output signal indicative of at least a quantization step difference in voltage between signals on said pair of inputs of a first one of said plurality of comparator stages.

11. The circuit of claim 10 wherein said MOS transistor switches are characterized by at least one of increasing channel widths and decreasing channel lengths in successive transfer stages.

12. The circuit of claim 10 wherein successive comparator stages have equal or decreasing voltage gains relative to preceding stages.

13. The circuit of claim 10 wherein each differential comparator includes a strobe terminal responsive to a strobe signal for passing complementary output signals to said pair of outputs via a latch.

14. The circuit of claim 10 wherein said means for providing a digital logic output signal is an R-S flip-flop.

15. The circuit of claim 14 wherein a latch with two inputs and two outputs is provided between said final comparator stage and said R-S input, said pair of outputs from said final comparator stage connected to said two inputs of said latch, said two outputs of said latch connected to a pair of inputs of said R-S flip-flop.

16. The circuit of claim 10 wherein said charge storage elements are capacitors.

17. The circuit of claim 10 wherein said comparator stages include differential cascode amplifiers connecting an input buffer to an output buffer.

18. The circuit of claim 17 wherein said comparator stages include voltage clamp means connected to the differential cascode amplifier and the output buffer for limiting internal voltage swings in said comparator stages.

19. The circuit of claim 10 wherein said comparator stages include means for enabling operation of said comparator stages on a low voltage power supply, said low voltage enabling means including unimplanted n-channel transistors in said differential amplifier.

* * * * *